(12) United States Patent
Liu et al.

(10) Patent No.: US 10,884,042 B2
(45) Date of Patent: Jan. 5, 2021

(54) POWER SYSTEM INERTIA ESTIMATION USING SYNCHROPHASOR FREQUENCY MEASUREMENTS

(71) Applicant: University of Tennessee Research Foundation, Knoxville, TN (US)

(72) Inventors: Yong Liu, Knoxville, TN (US); Yi Cui, Knoxville, TN (US); Yilu Liu, Knoxville, TN (US)

(73) Assignee: UNIVERSITY OF TENNESSEE RESEARCH FOUNDATION, Knoxville, TN (US)

( * ) Notice: Subject to any disclaimer, the term of this patent is extended or adjusted under 35 U.S.C. 154(b) by 150 days.

(21) Appl. No.: 16/000,495

(22) Filed: Jun. 5, 2018

(65) Prior Publication Data

US 2019/0369147 A1 Dec. 5, 2019

(51) Int. Cl.
*G01R 23/15* (2006.01)
*G06F 1/324* (2019.01)
(Continued)

(52) U.S. Cl.
CPC .......... *G01R 23/155* (2013.01); *G01R 23/06* (2013.01); *G06F 1/324* (2013.01); *H02J 3/14* (2013.01)

(58) Field of Classification Search
None
See application file for complete search history.

(56) References Cited

U.S. PATENT DOCUMENTS

| | | | | |
|---|---|---|---|---|
| 2017/0146585 | A1* | 5/2017 | Wang | G01R 19/2513 |
| 2018/0097363 | A1* | 4/2018 | Blood | H02J 3/24 |
| 2019/0288514 | A1* | 9/2019 | Shukla | G05B 15/02 |

OTHER PUBLICATIONS

Ashton et al. "Application of phasor measurement units to estimate power system intertial frequency response" 2013 IEEE Power & Energy Society General Meeting, Vancouver, BC, Canada, Jul. 21-25, 2013 (pp. 1-5).

(Continued)

*Primary Examiner* — Douglas X Rodriguez
(74) *Attorney, Agent, or Firm* — Myers Bigel, P.A.

(57) ABSTRACT

A method includes performing by a processor: receiving a first plurality of power system frequency measurements from a plurality of phasor measurement units (PMUs) in the power system over a first time interval, generating a first plurality of multi-dimensional ellipsoids based on the first plurality of power system frequency measurements, extracting a plurality of first graphic parameter values from the first plurality of multi-dimensional ellipsoids, respectively, performing a regression analysis on the plurality of first graphic parameter values to generate a predictive relationship between the plurality of first graphic parameter values and inertia values of the power system, receiving a second plurality of power system frequency measurements from the plurality of PMUs over a second time interval, generating a second plurality of multi-dimensional ellipsoids based on the second plurality of power system frequency measurements, extracting a plurality of second graphic parameter values from the second plurality of multi-dimensional ellipsoids, respectively, and estimating a current inertia value of the power system based on the plurality of second graphic parameter values by using the predictive relationship between the plurality of first graphic parameter values and the inertia values of the power system.

19 Claims, 10 Drawing Sheets

(51) Int. Cl.
  *G01R 23/06* (2006.01)
  *H02J 3/14* (2006.01)

(56) References Cited

OTHER PUBLICATIONS

Ashton et al. "Inertia Estimation of the GB Power System Using Synchrophasor Measurements" IEEE Transactions on Power Systems, 30(2):701-709 (2015).
Bai et al. "Measurement-based correlation approach for power system dynamic response estimation" IET Generation, Transmission & Distribution, 9(12):1474-1484 (2015).
Breiman, L. "Random Forests" Machine Learning, 45:5-32 (2001).
Chassin et al. "Estimation of WECC System Inertia Using Observed Frequency Transients" IEEE Transactions on Power Systems, 20(2):1190-1192 (2005).
Ikeguchi et al. "Estimation of Power System Inertia Constant and Capacity of Spinning-reserve Support Generators Using Measured Frequency Transients" IEEE Transactions on Power Systems, 12(1):137-143 (1997).
Jiang et al. "An adaptive PMU Based Fault Detection/Location Technique for Transmission Lines Part I: Theory and Algorithms" IEEE Transactions on Power Delivery, 15(2):486-493 (2000).
Liu et al. "Wide-Area-Measurement System Development at the Distribution Level: An FNET/GridEye Example" IEEE Transactions on Power Delivery, 31(2):721-731 (2016).
Ma et al. "The Characteristic Ellipsoid Methodology and its Application in Power Systems" IEEE Transactions on Power Systems, 27(4):2206-2214 (2012).
Ma et al. "Use Multi-Dimensional Ellipsoid to Monitor Dynamic Behavior of Power Systems Based on PMU Measurement" 2008 IEEE Power and Energy Society General Meeting—Conversion and Delivery of Electrical Energy in the 21st Century, Pittsburgh, PA, 2008, (pp. 1-8).
Rahman, R. "Package 'Multivariate Random Forest'" May 1, 2017 (13 pages).
Terzija, V. "Adaptive Underfrequency Load shedding Based on the Magnitude of the Disturbance Estimation" IEEE Transactions on Power Systems, 21(3):1260-1266 (2006).
Wall et al. "Estimation of generator inertia available during a disturbance" Proceedings of IEEE Power and Energy Society General Meeting, San Diego, CA, USA, Jul. 22-26, 2012(pp. 1-5).

* cited by examiner

TABLE I.
GRAPHIC PARAMETERS OF FREQUENCY ELLIPSOID AT DIFFERENT INERTIA LEVELS

| Graphic parameters | | 100% inertia | 50% inertia |
|---|---|---|---|
| Volume ($\times 10^{-13}$) | | 3.5 | 40 |
| Eccentricity | | 0.81 | 0.93 |
| Centers ($\times 10^{-6}$) | Unit 1 | 8.2 | 18 |
| | Unit 2 | -7.6 | -47 |
| | Unit 3 | -1.7 | -11 |
| Projection of the longest semi axes ($\times 10^{-6}$) | Unit 1 | 36 | -6.7 |
| | Unit 2 | -63 | -109 |
| | Unit 3 | 3.5 | 105 |

TABLE II.
FEATURE DECOMPOSITION OF THE FREQUENCY ELLIPSOID

| Features | Dimensions |
|---|---|
| Volume | 1 |
| Eccentricity | 1 |
| Centers | 20 |
| Projection of the longest axis | 20 |
| Total dimension | 42 |

TABLE III.
ESTIMATION ERROR OF DAILY SYSTEM INERTIA DURING HEAVY LOAD AND
LIGHT LOAD SEASONS

| Inertia estimation | $R^2$ | RMSE (MVA×s) |
|---|---|---|
| Heavy load | 0.99 | 8737 |
| Light Load | 0.98 | 6608 |

$R^2$: correlation coefficient, RMSE: root mean squared errors.

*FIG. 13*

POWER SYSTEM INERTIA ESTIMATION USING SYNCHROPHASOR FREQUENCY MEASUREMENTS

STATEMENT REGARDING FEDERALLY SPONSORED RESEARCH OR DEVELOPMENT

This invention was made with government support under contract number NSF EEC-1041877 awarded by the National Science Foundation. The government has certain rights in the invention.

BACKGROUND

The present disclosure relates to power systems, and, in particular, to frequency regulation of power systems.

The frequency of a power system may be affected by the balance between power generation and load consumption. Power consumption and/or power generation may both vary, which may result in the two rarely being precisely in balance. During normal operation, changes in frequency may be controlled by ancillary services that provide continuous, automatic frequency control through automatic generator control (AGC). However, severe electromechanical disturbances, such as generation trip and load reduction, can cause significant drops and/or increases in system frequency and may influence the dynamic behavior of a power grid. Therefore, it is generally desirable to prevent and/or reduce large deviations of the power system frequency from the nominal frequency during large disturbances and so as to improve the operational stability of power systems.

SUMMARY

In some embodiments of the inventive subject matter, a method comprises performing by a processor: receiving a first plurality of power system frequency measurements from a plurality of phasor measurement units (PMUs) in the power system over a first time interval, generating a first plurality of multi-dimensional ellipsoids based on the first plurality of power system frequency measurements, extracting a plurality of first graphic parameter values from the first plurality of multi-dimensional ellipsoids, respectively, performing a regression analysis on the plurality of first graphic parameter values to generate a predictive relationship between the plurality of first graphic parameter values and inertia values of the power system, receiving a second plurality of power system frequency measurements from the plurality of PMUs over a second time interval, generating a second plurality of multi-dimensional ellipsoids based on the second plurality of power system frequency measurements, extracting a plurality of second graphic parameter values from the second plurality of multi-dimensional ellipsoids, respectively, and estimating a current inertia value of the power system based on the plurality of second graphic parameter values by using the predictive relationship between the plurality of first graphic parameter values and the inertia values of the power system.

In other embodiments, a dimension number of each of the first plurality of multi-dimensional ellipsoids and a dimension number of each of the second plurality of multi-dimensional ellipsoids corresponds to a number of the plurality of PMUs.

In still other embodiments, extracting a plurality of first graphic parameter values from the first plurality of multi-dimensional ellipsoids, respectively, comprises: extracting a first plurality of values for each of a plurality of graphic parameters from the first plurality of multi-dimensional ellipsoids, respectively, the first graphic parameter being one of the plurality of graphic parameters. Performing the regression analysis on the plurality of first graphic parameter values to generate the predictive relationship between the plurality of first graphic parameter values and the inertia values of the power system comprises: performing the regression analysis on the first plurality of values for each of the plurality of graphic parameters to generate a predictive relationship between the first plurality of values for each of the plurality of graphic parameters and the inertia values of the power system. Extracting the plurality of second graphic parameter values from the second plurality of multi-dimensional ellipsoids, respectively, comprises: extracting a second plurality of values for each of the plurality of graphic parameters from the second plurality of multi-dimensional ellipsoids, respectively. Estimating the current inertia value of the power system based on the plurality of second graphic parameter values by using the predictive relationship between the plurality of first graphic parameter values and the inertia values of the power system comprises: estimating the current inertia value of the power system based on the second plurality of values for each of the plurality of graphic parameters by using the predictive relationship between the first plurality of values for each of the plurality of graphic parameters and the inertia values of the power system.

In still other embodiments, the plurality of graphic parameters comprises ellipsoid volume, ellipsoid eccentricity, ellipsoid center vector, and a projection vector of a longest semi-axis of the respective ellipsoid.

In still other embodiments, the plurality of graphic parameters further comprises a plurality of ellipsoid center vectors corresponding to the plurality of PMUs, respectively, and a plurality projection vectors of the longest semi-axis of the respective ellipsoids corresponding to the plurality of PMUs, respectively.

In still other embodiments, performing the regression analysis comprises performing a multivariate random forest regression analysis.

In still other embodiments, the method further comprises subtracting a first common frequency component from the first plurality of power system frequency measurements and subtracting a second common frequency component from the second plurality of power system frequency measurements. Generating the first plurality of multi-dimensional ellipsoids comprises generating the first plurality of multi-dimensional ellipsoids responsive to subtracting the first common frequency component from the first plurality of power system frequency measurements. Generating the second plurality of multi-dimensional ellipsoids comprises generating the second plurality of multi-dimensional ellipsoids responsive to subtracting the second common frequency component from the second plurality of power system frequency measurements.

In still other embodiments, the method further comprises adjusting an assignment of a power generator to a load in the power system based on the current inertia value of the power system.

In further embodiments of the inventive subject matter, a system comprises a processor and a memory coupled to the processor and comprising computer readable program code embodied in the memory that is executable by the processor to perform operations comprising: receiving a first plurality of power system frequency measurements from a plurality of phasor measurement units (PMUs) in the power system over a first time interval, generating a first plurality of multi-dimensional ellipsoids based on the first plurality of power system frequency measurements, extracting a plurality of first graphic parameter values from the first plurality of multi-dimensional ellipsoids, respectively, performing a regression analysis on the plurality of first graphic parameter values to generate a predictive relationship between the plurality of first graphic parameter values and inertia values of the power system, receiving a second plurality of power system frequency measurements from the plurality of PMUs over a second time interval, generating a second plurality of multi-dimensional ellipsoids based on the second plurality of power system frequency measurements, extracting a plurality of second graphic parameter values from the second plurality of multi-dimensional ellipsoids, respectively, and estimating a current inertia value of the power system based on the plurality of second graphic parameter values by using the predictive relationship between the plurality of first graphic parameter values and the inertia values of the power system.

In still further embodiments, a dimension number of each of the first plurality of multi-dimensional ellipsoids and a dimension number of each of the second plurality of multi-dimensional ellipsoids corresponds to a number of the plurality of PMUs.

In still further embodiments, extracting a plurality of first graphic parameter values from the first plurality of multi-dimensional ellipsoids, respectively, comprises extracting a first plurality of values for each of a plurality of graphic parameters from the first plurality of multi-dimensional ellipsoids, respectively, the first graphic parameter being one of the plurality of graphic parameters. Performing the regression analysis on the plurality of first graphic parameter values to generate the predictive relationship between the plurality of first graphic parameter values and the inertia values of the power system comprises performing the regression analysis on the first plurality of values for each of the plurality of graphic parameters to generate a predictive relationship between the first plurality of values for each of the plurality of graphic parameters and the inertia values of the power system. Extracting the plurality of second graphic parameter values from the second plurality of multi-dimensional ellipsoids, respectively, comprises extracting a second plurality of values for each of the plurality of graphic parameters from the second plurality of multi-dimensional ellipsoids, respectively. Estimating the current inertia value of the power system based on the plurality of second graphic parameter values by using the predictive relationship between the plurality of first graphic parameter values and the inertia values of the power system comprises estimating the current inertia value of the power system based on the second plurality of values for each of the plurality of graphic parameters by using the predictive relationship between the first plurality of values for each of the plurality of graphic parameters and the inertia values of the power system.

In still further embodiments, the plurality of graphic parameters comprises ellipsoid volume, ellipsoid eccentricity, ellipsoid center vector, and a projection vector of a longest semi-axis of the respective ellipsoid.

In still further embodiments, the plurality of graphic parameters further comprises a plurality of ellipsoid center vectors corresponding to the plurality of PMUs, respectively, and a plurality projection vectors of the longest semi-axis of the respective ellipsoids corresponding to the plurality of PMUs, respectively.

In still further embodiments, performing the regression analysis comprises performing a multivariate random forest regression analysis.

In still further embodiments, the operations further comprise subtracting a first common frequency component from the first plurality of power system frequency measurements and subtracting a second common frequency component from the second plurality of power system frequency measurements. Generating the first plurality of multi-dimensional ellipsoids comprises generating the first plurality of multi-dimensional ellipsoids responsive to subtracting the first common frequency component from the first plurality of power system frequency measurements. Generating the second plurality of multi-dimensional ellipsoids comprises generating the second plurality of multi-dimensional ellipsoids responsive to subtracting the second common frequency component from the second plurality of power system frequency measure.

In still further embodiments, the operations further comprise adjusting an assignment of a power generator to a load in the power system based on the current inertia value of the power system.

In other embodiments of the inventive subject matter, a computer program product, comprises a tangible computer readable storage medium comprising computer readable program code embodied in the medium that is executable by a processor to perform operations comprising: receiving a first plurality of power system frequency measurements from a plurality of phasor measurement units (PMUs) in the power system over a first time interval, generating a first plurality of multi-dimensional ellipsoids based on the first plurality of power system frequency measurements, extracting a plurality of first graphic parameter values from the first plurality of multi-dimensional ellipsoids, respectively, performing a regression analysis on the plurality of first graphic parameter values to generate a predictive relationship between the plurality of first graphic parameter values and inertia values of the power system, receiving a second plurality of power system frequency measurements from the plurality of PMUs over a second time interval, generating a second plurality of multi-dimensional ellipsoids based on the second plurality of power system frequency measurements, extracting a plurality of second graphic parameter values from the second plurality of multi-dimensional ellipsoids, respectively, and estimating a current inertia value of the power system based on the plurality of second graphic parameter values by using the predictive relationship between the plurality of first graphic parameter values and the inertia values of the power system.

In still other embodiments, extracting a plurality of first graphic parameter values from the first plurality of multi-dimensional ellipsoids, respectively, comprises extracting a first plurality of values for each of a plurality of graphic parameters from the first plurality of multi-dimensional ellipsoids, respectively, the first graphic parameter being one of the plurality of graphic parameters. Performing the regression analysis on the plurality of first graphic parameter values to generate the predictive relationship between the plurality of first graphic parameter values and the inertia values of the power system comprises performing the regression analysis on the first plurality of values for each of the plurality of graphic parameters to generate a predictive relationship between the first plurality of values for each of the plurality of graphic parameters and the inertia values of the power system. Extracting the plurality of second graphic parameter values from the second plurality of multi-dimensional ellipsoids, respectively, comprises extracting a second plurality of values for each of the plurality of graphic parameters from the second plurality of multi-dimensional ellipsoids, respectively. Estimating the current inertia value of the power system based on the plurality of second graphic parameter values by using the predictive relationship between the plurality of first graphic parameter values and the inertia values of the power system comprises estimating the current inertia value of the power system based on the second plurality of values for each of the plurality of graphic parameters by using the predictive relationship between the first plurality of values for each of the plurality of graphic parameters and the inertia values of the power system.

In still other embodiments, the operations further comprise subtracting a first common frequency component from the first plurality of power system frequency measurements and subtracting a second common frequency component from the second plurality of power system frequency measurements. Generating the first plurality of multi-dimensional ellipsoids comprises generating the first plurality of multi-dimensional ellipsoids responsive to subtracting the first common frequency component from the first plurality of power system frequency measurements. Generating the second plurality of multi-dimensional ellipsoids comprises generating the second plurality of multi-dimensional ellipsoids responsive to subtracting the second common frequency component from the second plurality of power system frequency measurements.

In still other embodiments, the operations further comprise adjusting an assignment of a power generator to a load in the power system based on the current inertia value of the power system.

Other methods, systems, articles of manufacture, and/or computer program products, according to embodiments of the inventive subject matter, will be or become apparent to one with skill in the art upon review of the following drawings and detailed description. It is intended that all such additional systems, methods, articles of manufacture, and/or computer program products be included within this description, be within the scope of the present inventive subject matter, and be protected by the accompanying claims.

BRIEF DESCRIPTION OF THE DRAWINGS

Other features of embodiments will be more readily understood from the following detailed description of specific embodiments thereof when read in conjunction with the accompanying drawings, in which:

FIG. 13 is a table that summarizes the estimation error between the estimated inertia values of FIG. 12 and the measured inertia in the operating power system.

DETAILED DESCRIPTION

Figure 1:
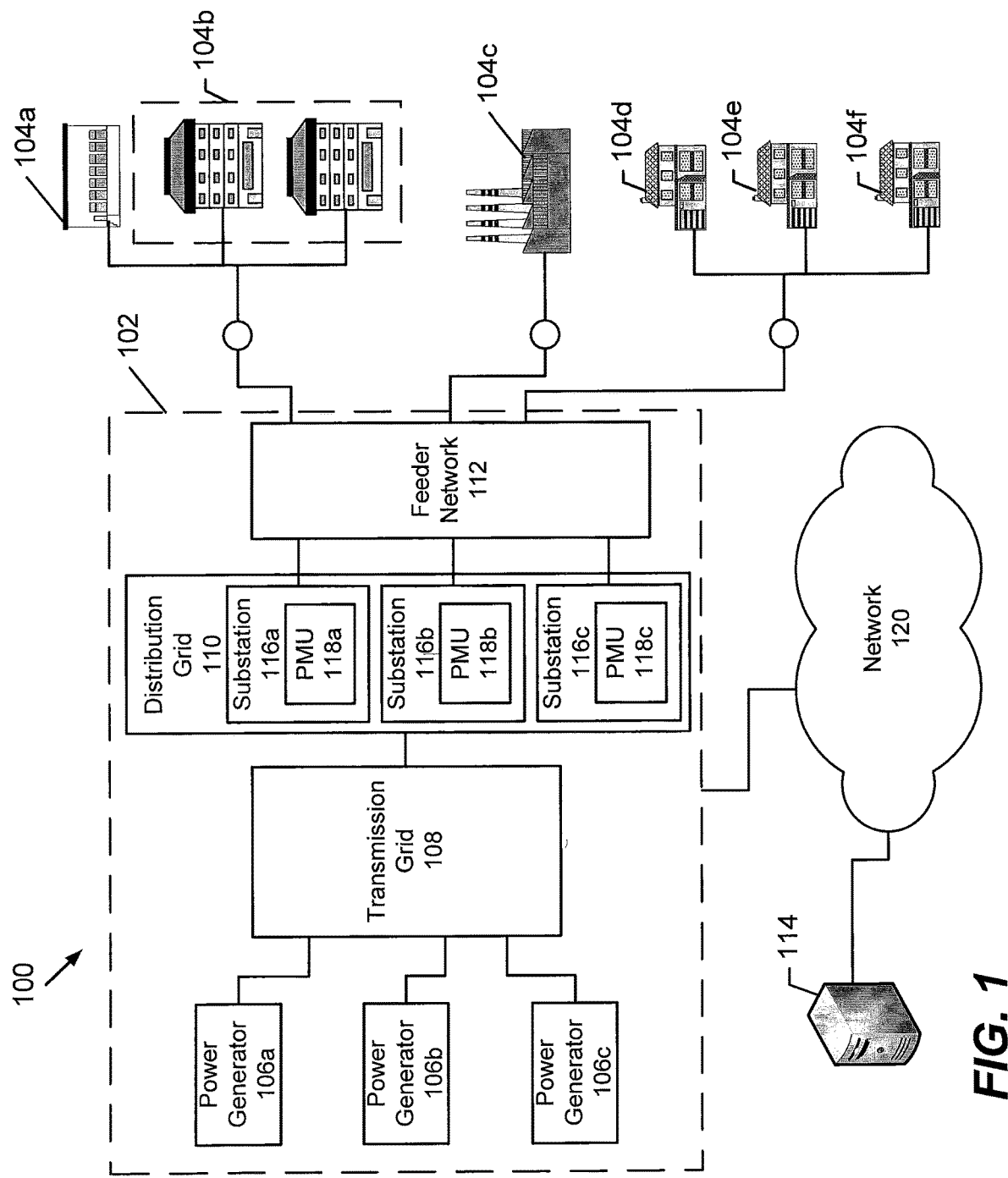
FIG. 1 is a block diagram that illustrates a power distribution network including a power system inertia estimation capability for power system frequency regulation in accordance with some embodiments of the inventive subject matter.

In the following detailed description, numerous specific details are set forth to provide a thorough understanding of embodiments of the present disclosure. However, it will be understood by those skilled in the art that the present invention may be practiced without these specific details. In some instances, well-known methods, procedures, components and circuits have not been described in detail so as not to obscure the present disclosure. It is intended that all embodiments disclosed herein can be implemented separately or combined in any way and/or combination. Aspects described with respect to one embodiment may be incorporated in different embodiments although not specifically described relative thereto. That is, all embodiments and/or features of any embodiments can be combined in any way and/or combination.

As used herein, the term "data processing facility" includes, but it is not limited to, a hardware element, firmware component, and/or software component. A data processing system may be configured with one or more data processing facilities.

Traditional methods for estimating power system inertia typically rely on the frequency response of system when the system is subjected to a significant disturbance. Significant deviations in frequency may occur when there is a large difference between the power supply and load consumption. Power system inertia can be represented as Equation 1, which is simplified by considering damping effects to be small during early onset of an event:

$$-\Delta P = M \cdot \frac{df}{dt} \quad (1)$$

where $$\frac{df}{dt}$$

is the rate of change of frequency (ROCOF) in Hertz per second, ΔP is the power change (pu in system load base), and M is the inertial constant in pu per second. In Equation 1, the initial frequency response after a disturbance to the active power balance is influenced by system inertia. After a large disturbance (e.g., the loss of a large generator or tie-line), the inertia in the system may influence the slope of the frequency drop and the time available to control it.

Although studies have been carried out to estimate the system inertia and provide support for adaptive frequency-control schemes (e.g., adaptive underfrequency load shedding), some existing methods for estimating inertia have been limited to postmortem analysis of frequency measurements recorded during a known disturbance to the system. It has been shown that the accuracy of an inertia estimate may be undermined by any errors in the estimation of the time of disturbance that is used during the calculation and online real-time estimation of system inertia may likewise be challenging.

Some embodiments of the inventive subject matter may stem from a realization that the development of sensor technology—a synchrophasor based wide-area measurement system (WAMS)—may provide a real time awareness of power system dynamics. By using high resolution data from Phasor Measurement Units (PMUs), dynamic characteristics of electrical parameters under different small disturbance events, e.g., ambient generation and load switching, can be revealed. In some embodiments, a plurality of PMUs are used to collect power system frequency measurements over a set of sliding time windows. These measurements may be used to construct characteristic ellipsoids in multi-dimensional space where dimension corresponds to the number of PMUs. One or more graphical parameter values may be extracted from each of the ellipsoids. A regression analysis may be performed on the graphic parameter values to generate a predictive relationship between the graphic parameter values and inertia values of the power system. Additional frequency measurements may be obtained from the PMUs, which can be converted into ellipsoids in multi-dimensional space and graphic parameter values extracted therefrom. The predictive relationship determined from the regression analysis may be applied to the newly extracted graphic parameter values to estimate a current inertia value of the power system. The current inertia value of the power system may be used in balancing the supplied power via one or more power generators with the load demand by power consumers. This may be done, for example, by changing the assignments of power generators to loads, adjusting the output of one or more power generators, and/or other balancing techniques between power generation capabilities and power demand/consumption. This current inertia value may be viewed as being obtained in real-time as the frequency measurements may be collected from the PMUs and processed without inserting any artificial scheduling or processing delays.

Referring to FIG. 1, a power system distribution network 100 including a power system inertia estimation capability for power system frequency regulation, in accordance with some embodiments of the inventive subject matter, comprises a main power grid 102, which is typically operated by a public or private utility, and which provides power to various power consumers 104a, 104b, 104c, 104d, 104e, and 104f. The electrical power generators 106a, 106b, and 106c are typically located near a fuel source, at a dam site, and/or at a site often remote from heavily populated areas. The power generators 106a, 106b, and 106c may be nuclear reactors, coal burning plants, hydroelectric plants, and/or other suitable facility for generating bulk electrical power. The power output from the power generators 106, 106b, and 106c is carried via a transmission grid or transmission network over potentially long distances at relatively high voltage levels. A distribution grid 110 may comprise multiple substations 116a, 116b, 116c, which receive the power from the transmission grid 108 and step the power down to a lower voltage level for further distribution. A feeder network 112 distributes the power from the distribution grid 110 substations 116a, 116b, 116c to the power consumers 104a, 104b, 104c, 104d, 104e, and 104f. The power substations 116a, 116b, 116c in the distribution grid 110 may step down the voltage level when providing the power to the power consumers 104a, 104b, 104c, 104d, 104e, and 104f through the feeder network 112.

As shown in FIG. 1, the power consumers 104a, 104b, 104c, 104d, 104e, and 104f may include a variety of types of facilities including, but not limited to, a warehouse 104a, a multi-building office complex 104b, a factory 104c, and residential homes 104d, 104e, and 104f. A feeder circuit may connect a single facility to the main power grid 102 as in the case of the factory 104c or multiple facilities to the main power grid 102 as in the case of the warehouse 104a and office complex 104b and also residential homes 104d, 104e, and 104f. Although only six power consumers are shown in FIG. 1, it will be understood that a feeder network 112 may service hundreds or thousands of power consumers.

The power distribution network 100 further comprises a Distribution Management System (DMS) 114, which may monitor and control the generation and distribution of power via the main power grid 102. The DMS 114 may comprise a collection of processors and/or servers operating in various portions of the main power grid 102 to enable operating personnel to monitor and control the main power grid 102. The DMS 114 may further include other monitoring and/or management systems for use in supervising the main power grid 102. One such system is known as the Supervisory Control and Data Acquisition (SCADA) system, which is a control system architecture that uses computers, networked data communications, and graphical user interfaces for high-level process supervisory management of the main power grid.

According to some embodiments of the inventive subject matter, PMUs 118a, 118b, and 118c may be located at the substations 116a, 116b, and 116c, respectively. PMUs measure current and voltage by amplitude and phase at selected stations of the distribution grid 110. Using Global Positioning System (GPS) information, for example, high-precision time synchronization may allow comparing measured values (synchrophasors) from different substations distant to each other and drawing conclusions regarding the system state and dynamic events, such as power swing conditions. The PMUs 118a, 118b, 118c may determine current and voltage phasors, frequency, and rate of change of frequency and provide these measurements with time stamps for transmittal to the DMS 114 for analysis. The PMUs 118a, 118b, 118c may communicate with the DMS 114 over the network 120. The network 120 may be a global network, such as the Internet or other publicly accessible network. Various elements of the network 120 may be interconnected by a wide area network, a local area network, an Intranet, and/or other private network, which may not be accessible by the general public. Thus, the communication network 120 may represent a combination of public and private networks or a virtual private network (VPN). The network 120 may be a wireless network, a wireline network, or may be a combination of both wireless and wireline networks.

Although FIG. 1 illustrates an exemplary a power distribution network 100 including a power system inertia estimation capability for power system frequency regulation, it will be understood that embodiments of the inventive subject matter are not limited to such configurations, but are intended to encompass any configuration capable of carrying out the operations described herein.

Figure 2:
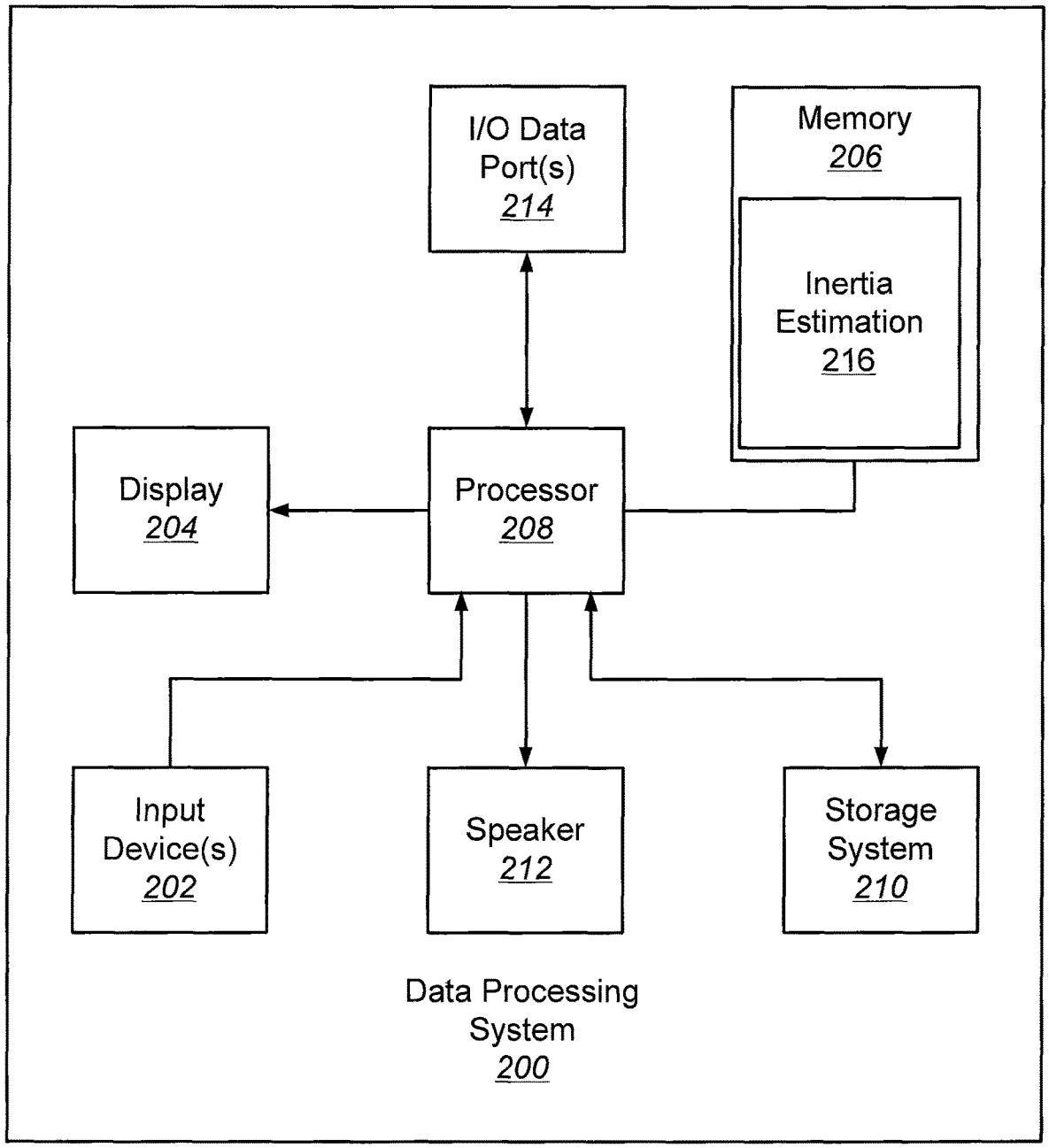
FIG. 2 illustrates a data processing system that may be used to implement a Distribution Management System (DMS) processor associated with a power system of FIG. 1 in accordance with some embodiments of the inventive subject matter.

Referring now to FIG. 2, a data processing system 200 that may be used to implement the DMS 114 processor of FIG. 1, in accordance with some embodiments of the inventive subject matter, comprises input device(s) 202, such as a keyboard or keypad, a display 204, and a memory 206 that communicate with a processor 208. The data processing system 200 may further include a storage system 210, a speaker 212, and an input/output (I/O) data port(s) 214 that also communicate with the processor 208. The storage system 210 may include removable and/or fixed media, such as floppy disks, ZIP drives, hard disks, or the like, as well as virtual storage, such as a RAMDISK. The I/O data port(s) 214 may be used to transfer information between the data processing system 200 and another computer system or a network (e.g., the Internet). These components may be conventional components, such as those used in many conventional computing devices, and their functionality, with respect to conventional operations, is generally known to those skilled in the art. The memory 206 may be configured with an inertia estimation module 216 that may provide functionality that may include, but is not limited to, estimating power system inertia in accordance with some embodiments of the inventive subject matter.

Figure 3:
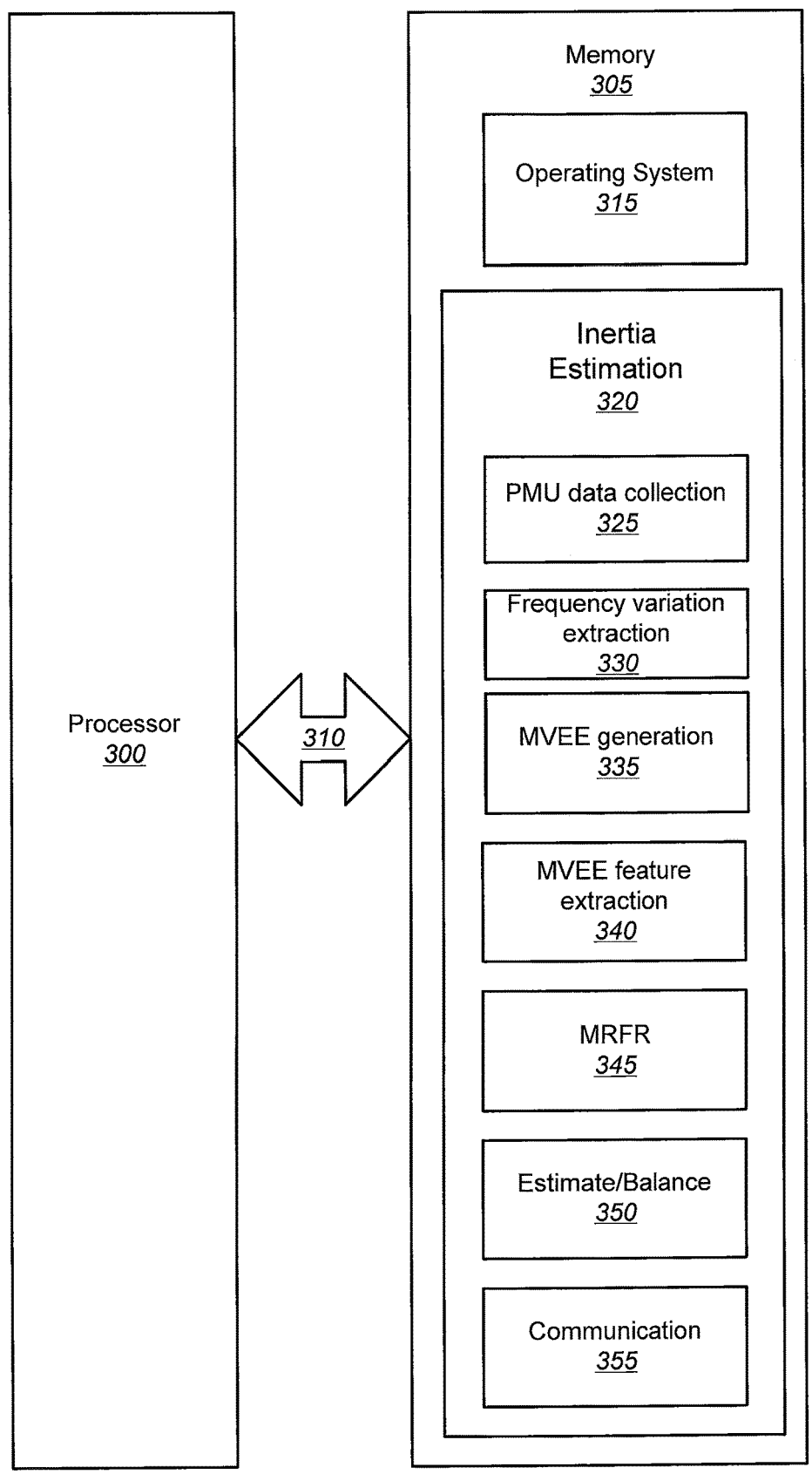
FIG. 3 is a block diagram that illustrates a software/hardware architecture for use in a DMS processor for estimating power system inertia and managing a power system based on the estimate in accordance with some embodiments of the inventive subject matter.

FIG. 3 illustrates a processor 300 and memory 305 that may be used in embodiments of data processing systems, such as the DMS 114 processor of FIG. 1 and the data processing system 200 of FIG. 2, respectively, for estimating power system inertia values and managing a power system, such as balancing power supply and demand, in accordance with some embodiments of the inventive subject matter. The processor 300 communicates with the memory 305 via an address/data bus 310. The processor 300 may be, for example, a commercially available or custom microprocessor. The memory 305 is representative of the one or more memory devices containing the software and data used for adjusting power demand for frequency regulation in accordance with some embodiments of the inventive subject matter. The memory 305 may include, but is not limited to, the following types of devices: cache, ROM, PROM, EPROM, EEPROM, flash, SRAM, and DRAM.

As shown in FIG. 3, the memory 305 may contain two or more categories of software and/or data: an operating system 315 and an inertia estimation module 320. In particular, the operating system 315 may manage the data processing system's software and/or hardware resources and may coordinate execution of programs by the processor 300. The inertia estimation module 320 may comprise a PMU data collection module 325, a frequency variation extraction module 330, a Minimum Volume Enclosing Ellipsoid (MVEE) generation module 335, an MVEE feature extraction module 340, a Multivariate Random Forest Regression (MRFR) module 345, an estimate/balance module 350, and a communication module 355.

The PMU data collection module may be configured to receive measured information, such as, for example, time-stamped power system frequency measurements from the PMUs 118a, 118b, and 118c in the distribution grid 110.

Figure 4:
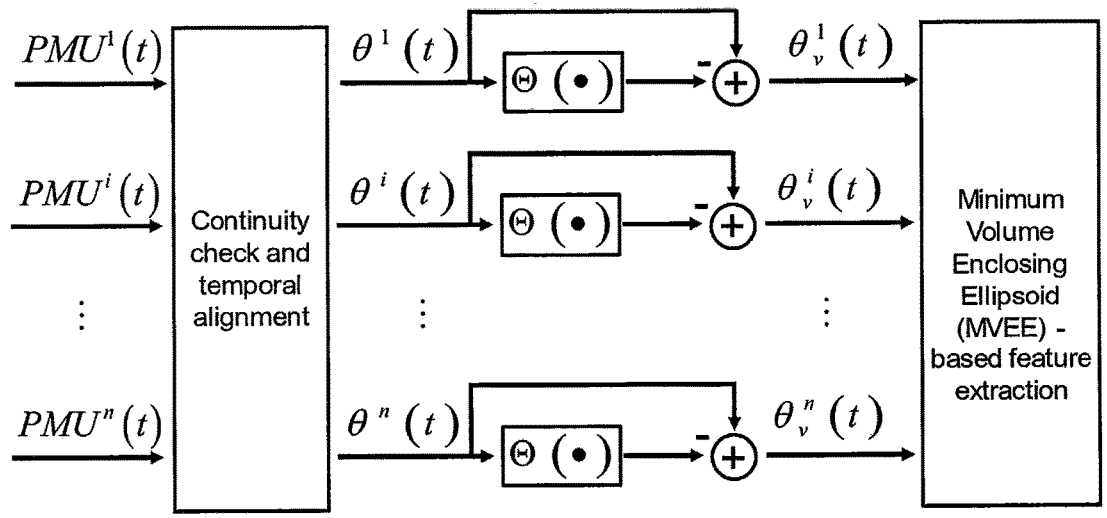
FIG. 4 is a block diagram that illustrates the removal of a common frequency component from received power system frequency measurements in accordance with some embodiments of the inventive concept.

The frequency variation extraction module 330 may be configured to remove a common frequency component from the power system frequency measurements. Removal of the common frequency component allows the variation in the ambient frequency measurements to be obtained for each of the PMUs 118a, 118b, and 118c. The frequency variation extraction module 330 may be further configured to perform additional pre-processing of the frequency measurement information by performing, for example, a data continuity check and/or discarding outlier measurements. For example, to estimate the inertia of power systems, data pre-processing, including a data continuity check, outlier detection and deletion, may be performed on the original ambient frequency data measured from multiple PMUs 118a, 118b, and 118c at different locations. Then median frequency at each time instance are calculated from the time synchronized ambient data to capture the common frequency component. Such a common frequency signal is further subtracted from the original ambient data to extract the variation of the ambient frequency measurements for each unit as shown in FIG. 4. Variation extraction of ambient frequency data through median filter can be expressed as Equation 2:

$$\theta_v^n(t) = \theta^n(t) - \Theta(\theta^1, \theta^2, \ldots, \theta^n) \qquad (2)$$

where $\theta^n(t)$ and $\theta_v^n(t)$ denote the original ambient frequency data and the extracted ambient frequency variation from n-th PMU, $\Theta(\theta^1, \theta^2, \ldots, \theta^n)$ denotes the median frequency of n PMUs.

The MVEE generation module 335 may be configured to organize the time series frequency measurements from the PMUs 118a, 118b, and 118c into a positive definite ellipsoid matrix, which is representative of a multi-dimensional closed ellipsoid. The dimension may correspond to the number of PMUs from which the frequency measurements are obtained. According to some embodiments of the inventive subject matter, MVEE generation may provide a technique to monitor the status of a power system and to estimate its dynamic behaviors, such as power system inertia, by interpreting the graphic parameters of a multi-dimensional closed ellipsoid. Such a characteristic ellipsoid with minimum volume is established, for example, by enclosing a certain part of the system trajectory in the phasor measurement space. The construction of the multi-dimensional closed ellipsoid can be formulated as enclosing phasor measurement points within an MVEE. The time series frequency measurements from multiple PMUs can be expressed as Equation 3.

$$\theta = \begin{bmatrix} \theta_{11} & \ldots & \theta_{1m} \\ \vdots & \ddots & \vdots \\ \theta_{n1} & \ldots & \theta_{nm} \end{bmatrix}, n < m \qquad (3)$$

where n is the number of PMUs, and m is the time instance of the frequency measurement.

The construction of the multi-dimensional closed ellipsoid can be formulated as Equation 4:

$$H_{A,c} = \{\theta \in \Omega^n | (\theta - c)^T A (\theta - c) \leq 1\} \qquad (4)$$

where the vector c denotes the center of the closed ellipsoid, and the positive definite ellipsoid matrix A determines the shape and orientation of the ellipsoid. $\Omega^n$ denotes n dimensional phasor measurement space. The solution of Equation 4 can be obtained by solving its dual optimization problem, i.e., maximize the square root of the determinant of A, i.e., det(A), subjected to $c \in \Omega^n$.

Once the ellipsoid matrix A and the center vector c are obtained, the orientation and the semi-axes of the characteristic ellipsoid can be calculated through singular value decomposition (SVD) as set forth in Equation 5:

$$A = PDQ^T \quad (5)$$

where $P=[p_1, p_2, \ldots, p_n]$ and $Q=[q_1, q_2, \ldots, q_n]^T$ are n×n matrix, $D=[\lambda_1, \lambda_2, \ldots \lambda_n]$ is a n×n diagonal matrix containing singular values subjected to $\lambda_1 \geq \lambda_2 \geq \ldots \lambda_n$.

The length of each semi-axis of the characteristic ellipsoid is expressed as Equation 6:

$$r_i = \frac{1}{\sqrt{\lambda_i}}, i = 1, 2, \ldots n \quad (6)$$

The projection matrix of the characteristic ellipsoid semi-axes on frequency measurement coordinates can be calculated as set forth in Equation 7:

$$R = \begin{bmatrix} p_{11}/\sqrt{\lambda_1} & \ldots & p_{1n}/\sqrt{\lambda_1} \\ \vdots & \ddots & \vdots \\ p_{n1}/\sqrt{\lambda_n} & \ldots & p_{nn}/\sqrt{\lambda_n} \end{bmatrix} \quad (7)$$

The volume of the characteristic ellipsoid can be calculated as set forth in Equation 8-10:

$$Vol(H_{A,c}) = \pi^{n/2} / \Gamma\left(\frac{n+2}{2}\right)\sqrt{\det(A)} \quad (8)$$

$$\Gamma(n/2) = (n-2)!!\sqrt{\pi}/2^{(n-1)/2} \quad (9)$$

$$n!! = \begin{cases} n \times (n-2) \times \ldots 3 \times 1, & n > 0, \text{ odd} \\ n \times (n-2) \times \ldots 4 \times 2, & n > 0, \text{ even} \\ 1 & n = -1, 0 \end{cases} \quad (10)$$

where $\Gamma$ is a standard gamma function.

The eccentricity of an ellipsoid can be calculated as set forth in Equation 11:

$$e_{cc} = \frac{\sqrt{r_{max}^2 - r_{min}^2}}{r_{max}}, e_{cc} \in [0, 1] \quad (11)$$

where $r_{min}$ and $r_{max}$ denote the minimum and maximum length of each semi-axis in Equation 6.

The MVEE feature extraction module 340 may be configured to extract informative features associated with power system inertia from the one or more ellipsoids generated by the MVEE generation module 335. For example, according to some embodiments of the inventive subject matter, graphic parameters of the characteristic ellipsoid generated by the MVEE generation module 335, including, for example, but not limited to, volume, center vectors, projection vectors of the longest semi-axis, and/or eccentricity, are derived from the characteristic ellipsoid to describe the states and dynamics of the power system and may also be used as informative features to estimate the system inertia. For example, once the variation of ambient data from each of the PMUs 118a, 118b, 118c is obtained from the frequency variation extraction module 330, they are divided into a series of time windows with certain window width. Then minimum volume enclosing ellipsoid is generated using the MVEE generation module 335 and the MVEE feature extraction module 340 is used to extract the features or graphic parameter values from the frequency measurement within each time window.

Figure 5A:
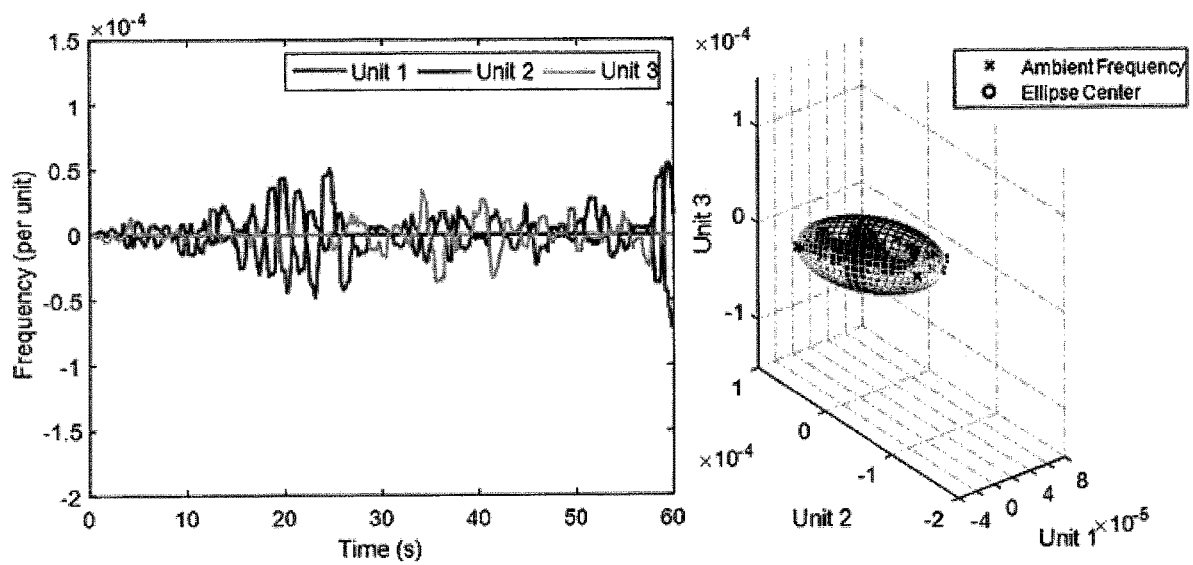
FIGS. 5A and 5B are graphical representations showing one minute of ambient frequency measurements from three Phasor Measurement Units (PMUs) at 100% and 50% inertia levels and the corresponding characteristic ellipsoids, respectively, in accordance with some embodiments of the inventive subject matter.
Figure 5B:
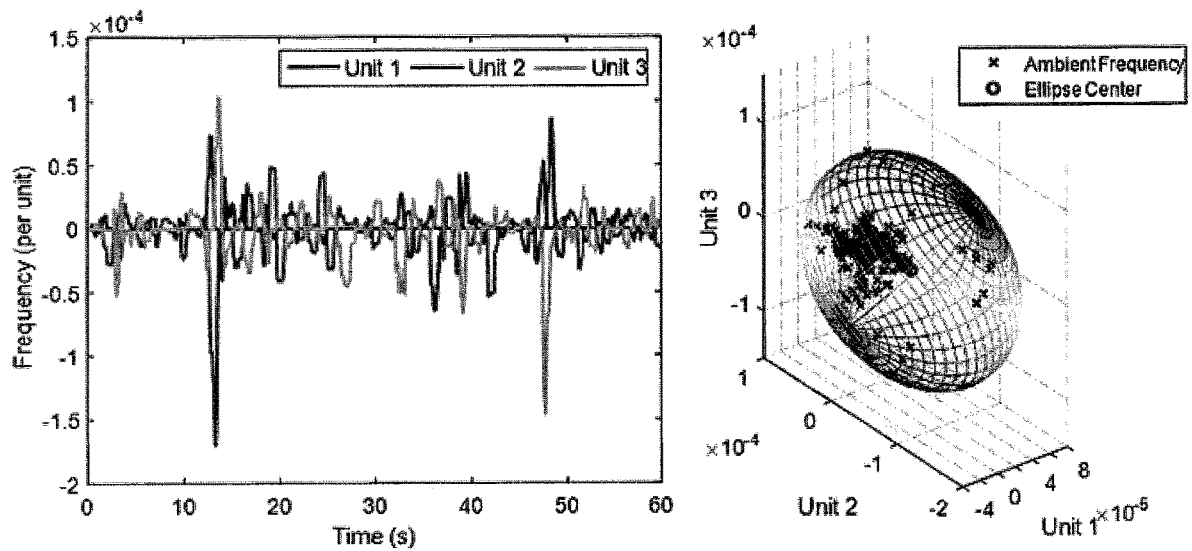

Due to the difficulties in illustrating a closed ellipsoid in the Cartesian coordinate system when the space dimension is greater than three, FIGS. 5A and 5B show 1 minute ambient frequency data from the three PMUs (Unit-1, Unit-2, Unit-3) at 100% and 50% inertia levels, respectively. The characteristic ellipsoids constructed from the frequency measurements using MVEE are also shown.

Figure 6:
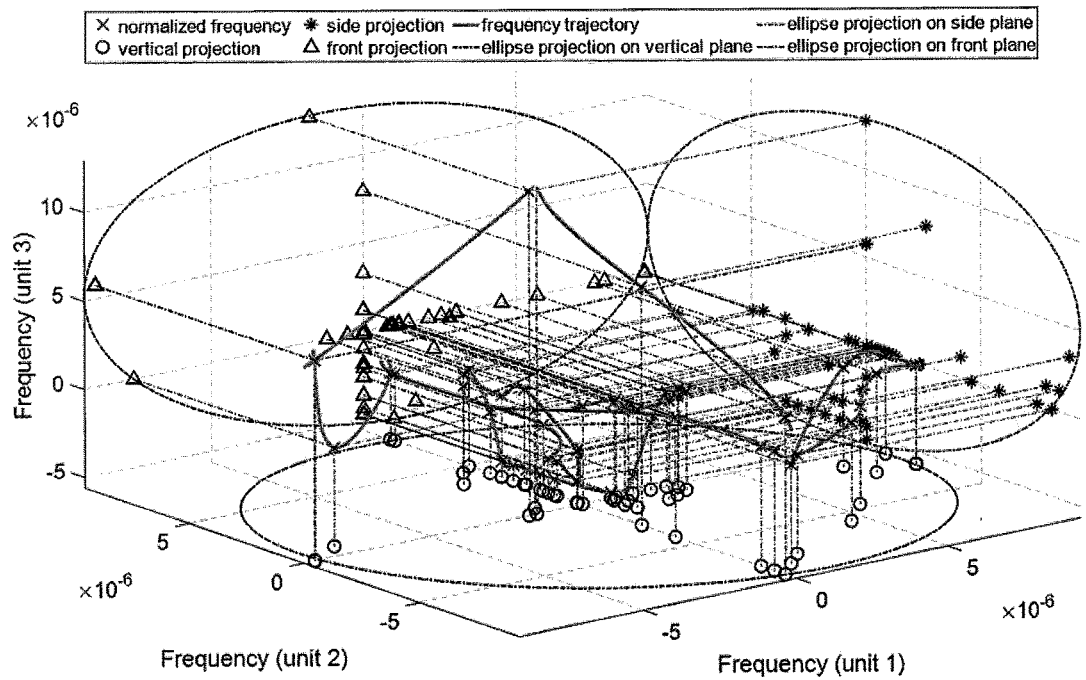
FIG. 6 is a graphical representation of a characteristic ellipsoid at 100% inertia level in accordance with some embodiments of the inventive subject matter.

In FIGS. 5A and 5B, the time series frequency data is normalized as per unit value using 60 Hz as reference. From FIGS. 5A and 5B, it can be seen the volume, center and orientation of each characteristic ellipsoid is determined by the frequency data. FIG. 6 shows the 10-second frequency trajectory and the projection of a characteristic ellipsoid at 100% inertia level. From FIG. 6 it can be seen the projection of the measured frequency in each dimension resides within the projected boundaries of the characteristic ellipsoid to ensure the minimal volume can be attained for the characteristic ellipsoid.

Figures 7, 8:
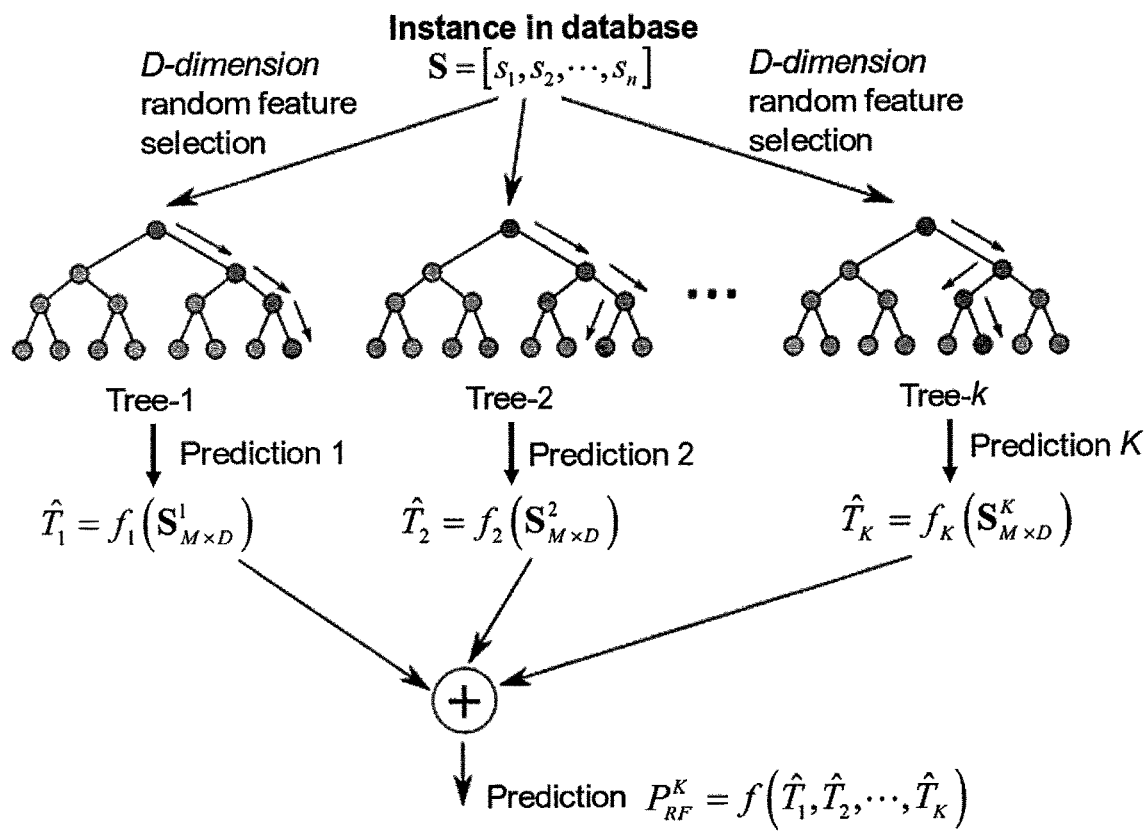
FIG. 7 is a table that summarizes graphic parameter values extracted from characteristic ellipsoids at different inertia levels.
FIG. 8 is a diagram that illustrates Multivariate Random Forest Regression (MRFR) operations for power system inertia estimation and power system management in accordance with some embodiments of the inventive subject matter.

TABLE I shown in FIG. 7 summarizes the graphic parameters of the characteristic ellipsoid at different inertia levels. From TABLE I it can be seen there is a significant increase in the volume of characteristic ellipsoid from 100% inertia level to 50% inertia. Generally, the volume of the ellipsoid may represent the deviation of frequency among different locations when the system is subjected to a small disturbance (i.e., ambient load switching) within a specific time interval. A high magnitude in the volume may indicate the deviation of frequency becomes significant, which may imply less inertia of the system. Such phenomenon can be also observed from the time derivate of the volume where a positive value in the time derivate may imply the power system possesses less inertia. Moreover, eccentricity of the characteristic ellipsoid may show an increase trend when the inertia level is reduced from 100% to 50%. Because the eccentricity measures how much an ellipsoid deviates from being a sphere (eccentricity equals zero indicates the ellipsoid is a sphere), a system with lower inertia may more easily experience a high magnitude in the frequency variation from a certain location, which may lead to an increase in ellipsoid eccentricity. In addition, the centers of the characteristic ellipsoid may be calculated as the mean values between the minimal and maximum frequency data from the corresponding PMUs within the specific time window. The projection of the longest semi-axis of unit-2 attains the highest magnitude among all three units. This indicates unit-2 has the largest frequency variation among the three units.

The MRFR module 345 may be configured to perform a regression analysis on the graphic parameter values extracted by the MVEE feature extraction module 340. In some embodiments of the inventive subject matter, MRFR is an ensemble of regression trees trained by bootstrap sampling and random feature selection. MRFR builds a large collection of regression trees and averages the output of each tree so as to reduce the variance of prediction results and boost the performance of the final predictive relationship model. MRFR may have a high robustness to the input data and may overcome the over-fitting problem during the training process which may lower the prediction accuracy of the model.

FIG. 8 is a diagram illustrating MRFR operations according to some embodiments of the inventive subject matter. Beginning with a training dataset $S=[s_1, s_2, \ldots, s_n]$ and the corresponding response $P=[p_1, p_2, \ldots, p_n]$, at each time, MRFR first uses bootstrap sampling to draw a set of samples with size M from the training dataset. Then it establishes a regression tree $\hat{T}_i$ based on these bootstrapped data. The following operations are recursively repeated for each terminal node of the tree, until the minimum node size is attained:

(1) Randomly select D dimension features of each bootstrapped sample in the training dataset.

(2) Split the parent node into two children nodes based on the information gain ratio criterion and the Gini index.

Such iterative operations are repeated K times and the output of the forest is the average of the predictions from each regression tree, which may be represented as Equation 12:

$$P_{RF}^{K} = \frac{1}{K}\sum_{i=1}^{K} \hat{T}_i(s) \qquad (12)$$

The estimate/balance module 350 may be configured to apply the predictive relationship determined from the MRFR operations to newly extracted graphic parameter values to estimate a current inertia value of the power system. The current inertia value of the power system may be used in balancing the supplied power via one or more power generators with the load demand by power consumers. In some embodiments of the inventive subject matter, the balancing may be performed, for example, by changing the assignments of power generators to loads, adjusting the output of one or more power generators, and/or other balancing techniques between power generation capabilities and power demand/consumption.

The communication module 355 may be configured to facilitate communication between the DMS 114 processor and the PMUs 118a, 118b, and 118c of FIG. 1 over the network 120.

Although FIG. 3 illustrates hardware/software architectures that may be used in data processing systems, such as the DMS 114 processor of FIG. 1 and the data processing system 200 of FIG. 2, respectively, for estimating power system inertia and managing a power system, such as balancing power supply and demand, in accordance with some embodiments of the inventive subject matter it will be understood that the present invention is not limited to such a configuration but is intended to encompass any configuration capable of carrying out operations described herein.

Computer program code for carrying out operations of data processing systems discussed above with respect to FIGS. 1-8 may be written in a high-level programming language, such as Python, Java, C, and/or C++, for development convenience. In addition, computer program code for carrying out operations of the present invention may also be written in other programming languages, such as, but not limited to, interpreted languages. Some modules or routines may be written in assembly language or even micro-code to enhance performance and/or memory usage. It will be further appreciated that the functionality of any or all of the program modules may also be implemented using discrete hardware components, one or more application specific integrated circuits (ASICs), or a programmed digital signal processor or microcontroller.

Moreover, the functionality of the DMS 114 processor of FIG. 1, the data processing system 200 of FIG. 2, and the hardware/software architecture of FIG. 3, may each be implemented as a single processor system, a multi-processor system, a multi-core processor system, or even a network of stand-alone computer systems, in accordance with various embodiments of the inventive subject matter. Each of these processor/computer systems may be referred to as a "processor" or "data processing system."

The data processing apparatus of FIGS. 1-3 may be used to facilitate the estimation of power system inertia and managing a power system, such as balancing power supply and demand, according to various embodiments described herein. These apparatus may be embodied as one or more enterprise, application, personal, pervasive and/or embedded computer systems and/or apparatus that are operable to receive, transmit, process and store data using any suitable combination of software, firmware and/or hardware and that may be standalone or interconnected by any public and/or private, real and/or virtual, wired and/or wireless network including all or a portion of the global communication network known as the Internet, and may include various types of tangible, non-transitory computer readable media. In particular, the memory 206 coupled to the processor 208 and the memory 305 coupled to the processor 300 include computer readable program code that, when executed by the respective processors, causes the respective processors to perform operations including one or more of the operations described herein with respect to FIGS. 4-13.

Figure 9:
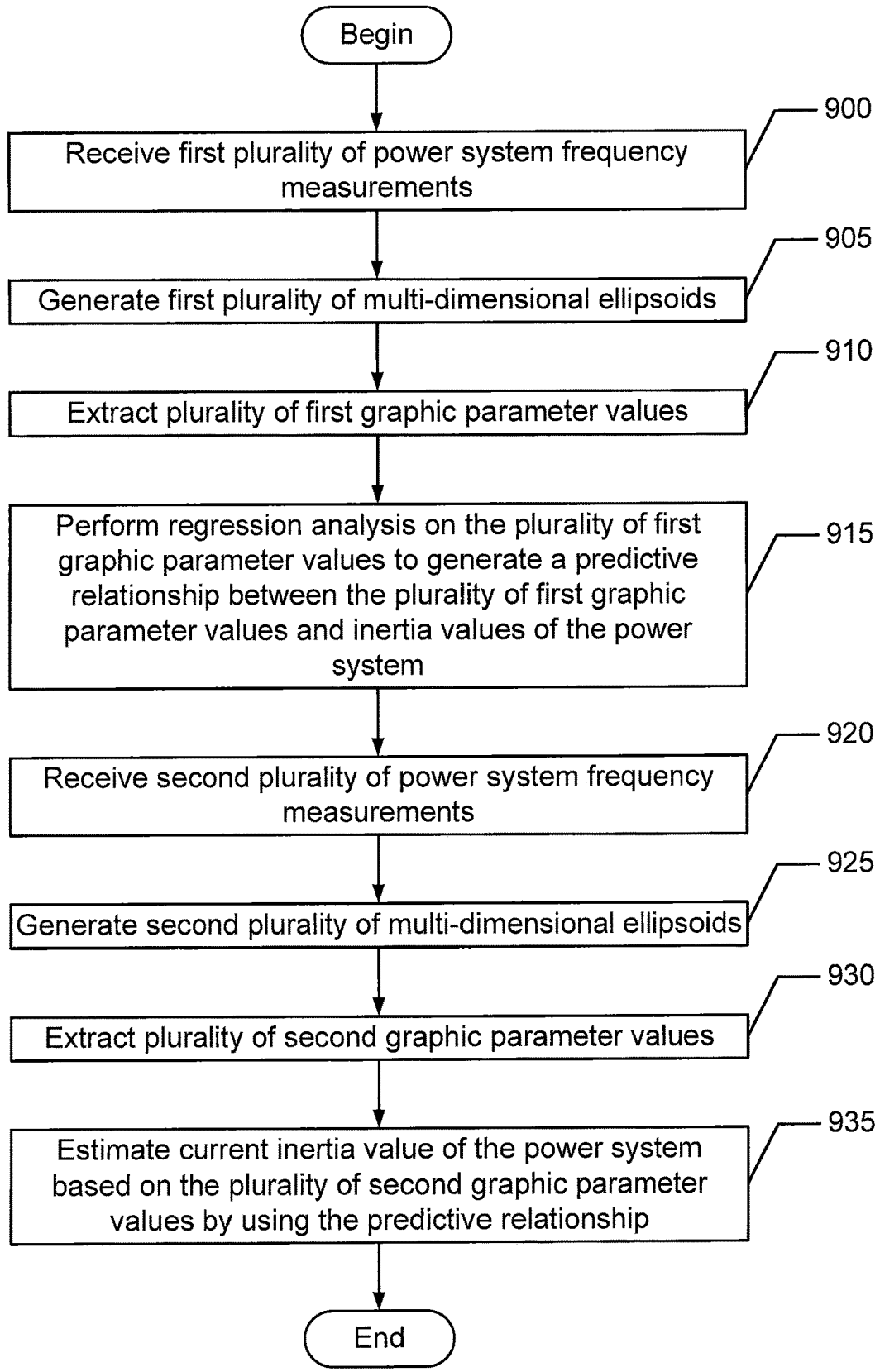
FIG. 9 is a flowchart that illustrates operations for power system inertia estimation and power system management in accordance with some embodiments of the inventive subject matter.

FIG. 9 is a flowchart that illustrates operations for estimating a power system inertia and managing a power system, such as balancing power supply and demand, in accordance with some embodiments of the inventive subject matter. Operations begin at block 900 where the DMS 114 receives a first plurality of power system frequency measurements from the PMUs 118a, 118b, and/or 118c. It will be understood that while only three PMUs are illustrated in FIG. 1, fewer or more PMUs may be used in accordance with various embodiments of the inventive subject matter. In some embodiments, the power system frequency measurements may be pre-processed using the frequency variation extraction to discard outlier measurements and/or remove a common frequency component from the frequency measurements. At block 905, the MVEE generation module 335 generates first plurality of multi-dimensional ellipsoids based on the first plurality of power system frequency measurements. The MVEE feature extraction module 340 may extract a plurality of first graphic parameter values from the multi-dimensional ellipsoids at block 910. In accordance with some embodiments of the inventive subject matter, the graphic parameters may comprise one or more of ellipsoid volume, ellipsoid eccentricity, ellipsoid center vector, and projection vector of the longest semi-axis. A regression analysis, such as an MRFR analysis may be performed using the MRFR module 345 at block 915 to generate a predictive relationship between the plurality of first graphic parameter values and inertia values of the power system. The ambient frequency measurements may be viewed as a training data set to develop the predictive relationship between the power system frequency information and the power system inertia values through use of MRFR analysis of an MVEE representation of the frequency measurements. At block 920, a second plurality of power system frequency measurements are received at the DMS 114 from the PMUs 118a, 118b, and/or 118c. These frequency measurements may be current or real-time frequency measurements obtained from the distribution grid 110. A second plurality of multi-dimensional ellipsoids may be generated at block 925 based on the second plurality of power system frequency measurements. The MVEE feature extraction module 340 may be used to extract a plurality of second graphic parameter values from the second plurality of multi-dimensional ellipsoids at block 930. The estimate/balance module 350 may be used to estimate the current inertia value of the power system at block 935 based on the plurality of second graphic parameter values by using the predictive relationship generated by the MRFR module 345 at block 915 output from the regression analysis.

Embodiments of the inventive subject matter may be illustrated by way of example. The use of MVEE representation of power system frequency measurements, extracting graphic parameter values from the generated ellipsoids, and using MRFR to generate a predictive relationship for estimating power system inertia based on recent power system frequency measurements has been experimentally applied to the Western Electricity Coordinating Council (WECC) interconnections in North America. A Wide-Area Frequency Monitoring Network (FNET/GridEye) is a pilot wide area frequency monitoring system mainly implemented on the distribution level of a power grid. During the experiment, there were more than three hundred distribution level PMUs installed in the North America power grid, which continuously measure frequency, voltage magnitude and voltage phase angle to provide real time awareness of power system states. Based on the high resolution frequency measurements from FNET/Grid Eye, a large volume of phasor measurements were collected, which can be used to estimate the power system inertia.

Figure 10:
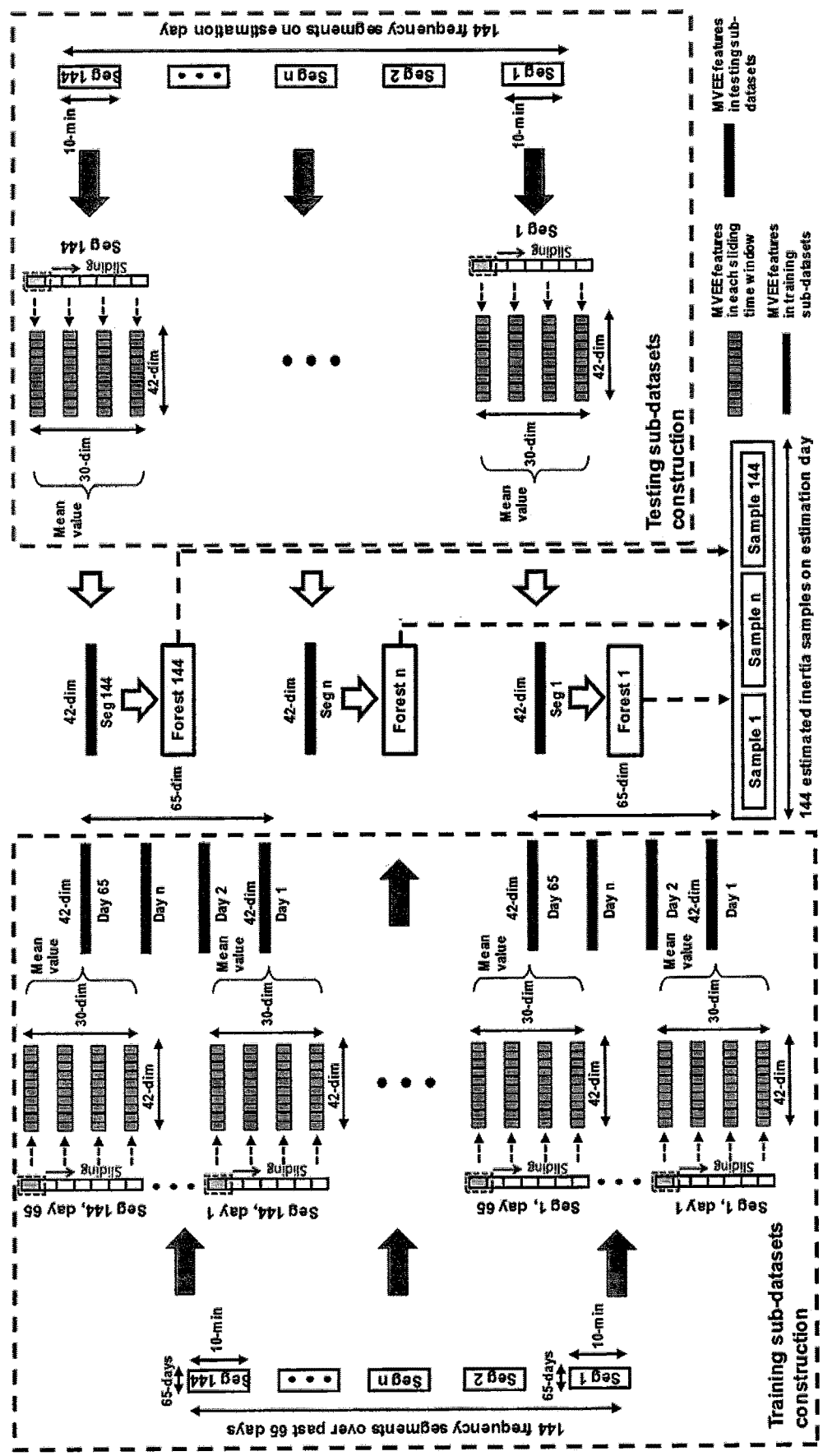
FIG. 10 is a diagram that illustrates the inertia estimation through ambient frequency measurements in accordance with some embodiments of the inventive subject matter.

FIG. 10 shows the diagram of inertia estimation operations through ambient frequency measurements. The inertia data of WECC was provided by North American Electric Reliability Corporation (NERC), which continuously monitors the number of committed generators in the whole interconnection and measures real-time system inertia. The data covers the whole year inertia variation of the system. More than 40 PMUs were deployed in WECC networks. Considering the data quality of each unit (e.g., data continuity, outlier data), frequency data from 20 PMUs in WECC were collected. Because the system inertia varies daily and seasonally (daily/seasonal peak and valley), only frequency data within the recent 65 days of the estimation day are used for training. This aims at improving the estimation accuracy of system inertia by selecting the frequency measurements in the same season as the estimation day to train the MRFR model. If the date for inertia estimation is beyond 65 days from the latest inertia data in WECC, then inertia data on the same calendar date as the estimation day is used as the reference date and the inertia data in the past 65 days from this reference date (including the inertia on the reference date) are used for training the algorithm.

In FIG. 10, the ambient frequency from 20 PMUs is first grouped by each 10 minutes on each day, producing 1440/10=144 ambient synchrophasor databases. Each ambient synchrophasor database contains 10 minutes of frequency measurements from 20 PMUs over the past 65 days from the reference date. For each day, a moving window with a 5-minutes window width is used to scan the 10-minutes of frequency measurements. Then the frequency measurements are represented in multi-dimensions using MVEE operations and graphic parameter values are extracted therefrom (i.e., volume, center vectors, projection vectors of the longest semi-axis, eccentricity) of the characteristic ellipsoids based on the frequency segments within each time window. A total of 42 features are extracted from frequency segments in each time window as shown in Table II in FIG. 11. The moving step of the time window is 10 seconds. A total of 30 sets of graphic parameters (from 30 characteristic ellipsoids) are calculated from each 10 minutes of frequency segments and the average values of each graphic parameter over the 30 sets (e.g., average of volume from 30 ellipsoids) are used as the input features for MRFR analysis.

The inertia of the WECC system was estimated as follows: First, the dataset containing graphic parameters extracted from the frequency measurements in the past 65 days from the estimation (reference) day was derived to construct the training sub-dataset. Then ten-fold cross-validation was performed on the training sub-dataset to determine the optimal parameters of the MRFR analysis, including the total tree number of the forest, minimal leaves of each regression tree and number of features that are randomly selected by each tree. After finding the optimal values of the above parameters, the MRFR model was trained on the whole training sub-dataset. Subsequently, the trained model was applied to estimate the system inertia using graphic parameters extracted from the ambient frequency on the estimation day.

Figures 11, 12:
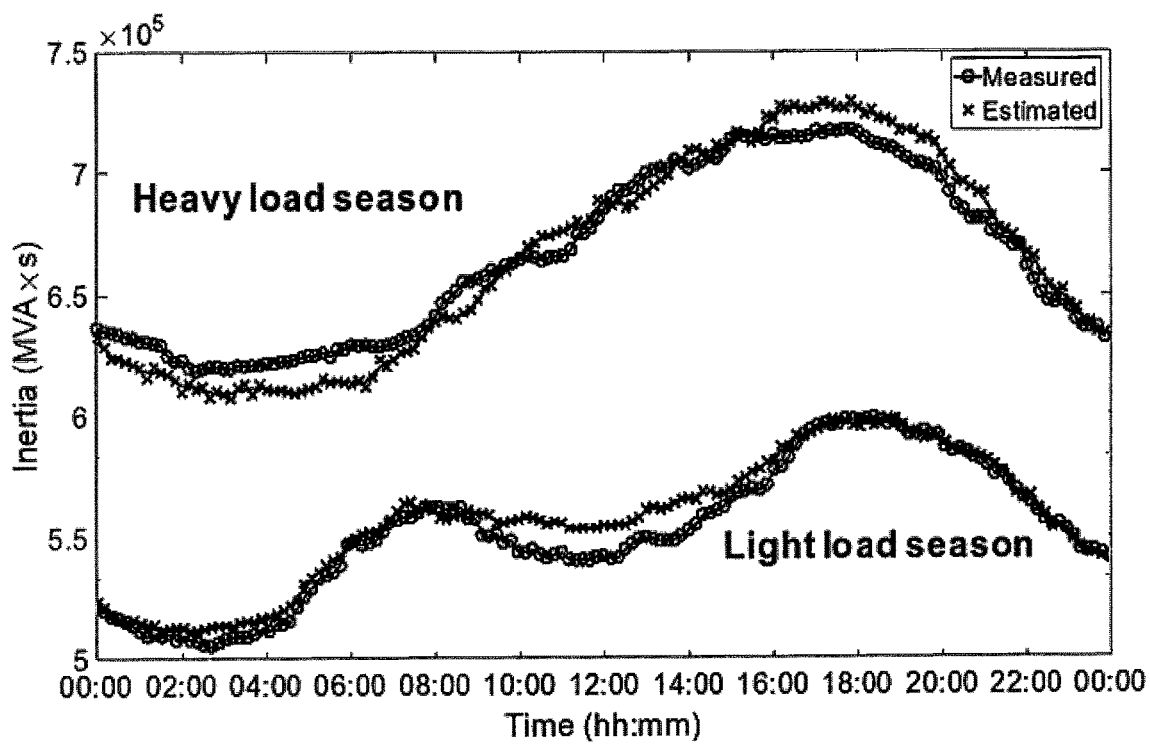
FIG. 11 is a table that summarizes graphic parameters that are identified for extraction from characteristic ellipsoids generated based on experimental data from an operating power system in accordance with some embodiments of the inventive subject matter.
FIG. 12 is a graphical representation of estimated inertia values determined according to some embodiments of the inventive subject matter and measured inertia values in the operating power system.

FIG. 12 compares the measured and estimated daily inertia during heavy load and light load seasons. To evaluate the performance of estimating power system inertia, according to some embodiments of the inventive subject matter, coefficient of determination and root mean squared error between the measured and estimated daily system inertia were calculated, which are summarized in Table III shown in FIG. 13. From Table III it can be seen that the daily inertia of a power system can be estimated with relatively high accuracy using the techniques based on MVEE and MRFR described herein according to some embodiments of the inventive subject matter. The coefficients of determination of estimated inertia during heavy load and light load seasons are all above 0.9. Compared with the light load season, the root mean squared error of estimated daily inertia in heavy season is relatively higher (8737 MVA×s). However, the estimation error of the daily inertia is still lower than 2% of the daily peak values.

The inertia in a power system inertia is a factor in determining the frequency stability of the power system. Embodiments of the inventive subject matter described herein may provide systems, methods, and/or computer program products for online estimation of system inertia from ambient synchrophasor measurements. Informative features regarding power system inertia may be extracted from the historical frequency measurements at multiple locations through representation of the frequency measurements via MVEE technique. The extracted features may be used to train a MRFR model to learn the underlying relationship between the features and system inertia. The trained MRFR model may be used to estimate on the inertia of the power system based on frequency measurements of interest, e.g., recent and/or real time frequency measurements from PMUs. Results from experimental studies have demonstrated the effectiveness of the above-described operations for estimating power system inertia according to various embodiments of the inventive subject matter. The accuracy of systems, methods, and/or computer program product embodiments described herein may be vary based on the number/density of PMUs from which frequency measurements may be collected in the power system grid and/or the selection of the most reliable frequency measurements from the most relevant PMUs.

Further Definitions and Embodiments

In the above-description of various embodiments of the present disclosure, aspects of the present disclosure may be illustrated and described herein in any of a number of patentable classes or contexts including any new and useful process, machine, manufacture, or composition of matter, or any new and useful improvement thereof. Accordingly, aspects of the present disclosure may be implemented entirely hardware, entirely software (including firmware, resident software, micro-code, etc.) or combining software and hardware implementation that may all generally be referred to herein as a "circuit," "module," "component," or "system." Furthermore, aspects of the present disclosure may take the form of a computer program product comprising one or more computer readable media having computer readable program code embodied thereon.

Any combination of one or more computer readable media may be used. The computer readable media may be a computer readable signal medium or a computer readable storage medium. A computer readable storage medium may be, for example, but not limited to, an electronic, magnetic, optical, electromagnetic, or semiconductor system, apparatus, or device, or any suitable combination of the foregoing. More specific examples (a non-exhaustive list) of the computer readable storage medium would include the following: a portable computer diskette, a hard disk, a random access memory (RAM), a read-only memory (ROM), an erasable programmable read-only memory (EPROM or Flash memory), an appropriate optical fiber with a repeater, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electromagnetic, optical, or any suitable combination thereof. A computer readable signal medium may be any computer readable medium that is not a computer readable storage medium and that can communicate, propagate, or transport a program for use by or in connection with an instruction execution system, apparatus, or device. Program code embodied on a computer readable signal medium may be transmitted using any appropriate medium, including but not limited to wireless, wireline, optical fiber cable, RF, etc., or any suitable combination of the foregoing.

Computer program code for carrying out operations for aspects of the present disclosure may be written in any combination of one or more programming languages, including an object oriented programming language such as Java, Scala, Smalltalk, Eiffel, JADE, Emerald, C++, C#, VB.NET, Python or the like, conventional procedural programming languages, such as the "C" programming language, Visual Basic, Fortran 2003, Perl, COBOL 2002, PHP, ABAP, LabVIEW, dynamic programming languages, such as Python, Ruby and Groovy, or other programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider) or in a cloud computing environment or offered as a service such as a Software as a Service (SaaS).

Aspects of the present disclosure are described herein with reference to flowchart illustrations and/or block diagrams of methods, apparatus (systems), and computer program products according to embodiments of the disclosure. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable instruction execution apparatus, create a mechanism for implementing the functions/acts specified in the flowchart and/or block diagram block or blocks.

These computer program instructions may also be stored in a computer readable medium that when executed can direct a computer, other programmable data processing apparatus, or other devices to function in a particular manner, such that the instructions when stored in the computer readable medium produce an article of manufacture including instructions which when executed, cause a computer to implement the function/act specified in the flowchart and/or block diagram block or blocks. The computer program instructions may also be loaded onto a computer, other programmable instruction execution apparatus, or other devices to cause a series of operational steps to be performed on the computer, other programmable apparatuses or other devices to produce a computer implemented process such that the instructions which execute on the computer or other programmable apparatus provide processes for implementing the functions/acts specified in the flowchart and/or block diagram block or blocks.

The flowchart and block diagrams in the figures illustrate the architecture, functionality, and operation of possible implementations of systems, methods, and computer program products according to various aspects of the present disclosure. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

The present disclosure of embodiments has been presented for purposes of illustration and description, but is not intended to be exhaustive or limited to the disclosure in the form disclosed. Many variations and modifications can be made to the embodiments without substantially departing from the principles of the present invention. All such variations and modifications are intended to be included herein within the scope of the present invention.

What is claimed is:

1. A method comprising:
performing by a processor:
receiving a first plurality of power system frequency measurements from a plurality of phasor measurement units (PMUs) in the power system over a first time interval;
generating a first plurality of multi-dimensional ellipsoids based on the first plurality of power system frequency measurements;
extracting a first plurality of values for each of a plurality of graphic parameters from the first plurality of multi-dimensional ellipsoids, respectively, the first graphic parameter being one of the plurality of graphic parameters;
performing a regression analysis on the first plurality of values for each of the plurality of graphic parameters to generate a predictive relationship between the first plurality of values for each of the plurality of graphic parameters and the inertia values of the power system;
receiving a second plurality of power system frequency measurements from the plurality of PMUs over a second time interval;
generating a second plurality of multi-dimensional ellipsoids based on the second plurality of power system frequency measurements;
extracting a second plurality of values for each of the plurality of graphic parameters from the second plurality of multi-dimensional ellipsoids, respectively; and
estimating a current inertia value of the power system based on the second plurality of values for each of the plurality of graphic parameters by using the predictive relationship between the first plurality of values for each of the plurality of graphic parameters and the inertia values of the power system.

2. The method of claim 1, wherein a dimension number of each of the first plurality of multi-dimensional ellipsoids and a dimension number of each of the second plurality of multi-dimensional ellipsoids corresponds to a number of the plurality of PMUs.

3. The method of claim 1, wherein performing the regression analysis comprises performing a multivariate random forest regression analysis.

4. The method of claim 1, further comprising:
subtracting a first common frequency component from the first plurality of power system frequency measurements; and
subtracting a second common frequency component from the second plurality of power system frequency measurements;
wherein generating the first plurality of multi-dimensional ellipsoids comprises:
generating the first plurality of multi-dimensional ellipsoids responsive to subtracting the first common frequency component from the first plurality of power system frequency measurements; and
wherein generating the second plurality of multi-dimensional ellipsoids comprises:
generating the second plurality of multi-dimensional ellipsoids responsive to subtracting the second common frequency component from the second plurality of power system frequency measurements.

5. The method of claim 1, further comprising:
adjusting an assignment of a power generator to a load in the power system based on the current inertia value of the power system.

6. The method of claim 1, wherein the plurality of graphic parameters comprises ellipsoid volume, ellipsoid eccentricity, ellipsoid center vector, or a projection vector of a longest semi-axis of the respective ellipsoid.

7. The method of claim 6, wherein the plurality of graphic parameters further comprises a plurality of ellipsoid center vectors corresponding to the plurality of PMUs, respectively, and a plurality projection vectors of the longest semi-axis of the respective ellipsoids corresponding to the plurality of PMUs, respectively.

8. A system, comprising:
a processor; and
a memory coupled to the processor and comprising computer readable program code embodied in the memory that is executable by the processor to perform operations comprising:
receiving a first plurality of power system frequency measurements from a plurality of phasor measurement units (PMUs) in the power system over a first time interval;
generating a first plurality of multi-dimensional ellipsoids based on the first plurality of power system frequency measurements;
extracting a first plurality of values for each of a plurality of graphic parameters from the first plurality of multi-dimensional ellipsoids, respectively, the first graphic parameter being one of the plurality of graphic parameters;
performing a regression analysis on the first plurality of values for each of the plurality of graphic parameters to generate a predictive relationship between the first plurality of values for each of the plurality of graphic parameters and the inertia values of the power system;
receiving a second plurality of power system frequency measurements from the plurality of PMUs over a second time interval;
generating a second plurality of multi-dimensional ellipsoids based on the second plurality of power system frequency measurements;
extracting a second plurality of values for each of the plurality of graphic parameters from the second plurality of multi-dimensional ellipsoids, respectively; and
estimating a current inertia value of the power system based on the second plurality of values for each of the plurality of graphic parameters by using the predictive relationship between the first plurality of values for each of the plurality of graphic parameters and the inertia values of the power system.

9. The system of claim 8, wherein a dimension number of each of the first plurality of multi-dimensional ellipsoids and a dimension number of each of the second plurality of multi-dimensional ellipsoids corresponds to a number of the plurality of PMUs.

10. The system of claim 8, wherein performing the regression analysis comprises performing a multivariate random forest regression analysis.

11. The system of claim 8, wherein the operations further comprise:
subtracting a first common frequency component from the first plurality of power system frequency measurements; and subtracting a second common frequency component from the second plurality of power system frequency measurements;

wherein generating the first plurality of multi-dimensional ellipsoids comprises:

generating the first plurality of multi-dimensional ellipsoids responsive to subtracting the first common frequency component from the first plurality of power system frequency measurements; and wherein generating the second plurality of multi-dimensional ellipsoids comprises:

generating the second plurality of multi-dimensional ellipsoids responsive to subtracting the second common frequency component from the second plurality of power system frequency measure.

12. The system of claim 8, wherein the operations further comprise:

adjusting an assignment of a power generator to a load in the power system based on the current inertia value of the power system.

13. The system of claim 8, wherein the plurality of graphic parameters comprises ellipsoid volume, ellipsoid eccentricity, ellipsoid center vector, or a projection vector of a longest semi-axis of the respective ellipsoid.

14. The system of claim 13, wherein the plurality of graphic parameters further comprises a plurality of ellipsoid center vectors corresponding to the plurality of PMUs, respectively, and a plurality projection vectors of the longest semi-axis of the respective ellipsoids corresponding to the plurality of PMUs, respectively.

15. A computer program product, comprising:

a non-transitory computer readable storage medium comprising computer readable program code embodied in the medium that is executable by a processor to perform operations comprising:

receiving a first plurality of power system frequency measurements from a plurality of phasor measurement units (PMUs) in the power system over a first time interval;

generating a first plurality of multi-dimensional ellipsoids based on the first plurality of power system frequency measurements;

extracting a first plurality of values for each of a plurality of graphic parameters from the first plurality of multi-dimensional ellipsoids, respectively, the first graphic parameter being one of the plurality of graphic parameters;

performing a regression analysis on the first plurality of values for each of the plurality of graphic parameters to generate a predictive relationship between the first plurality of values for each of the plurality of graphic parameters and the inertia values of the power system;

receiving a second plurality of power system frequency measurements from the plurality of PMUs over a second time interval;

generating a second plurality of multi-dimensional ellipsoids based on the second plurality of power system frequency measurements;

extracting a second plurality of values for each of the plurality of graphic parameters from the second plurality of multi-dimensional ellipsoids, respectively; and estimating a current inertia value of the power system based on the second plurality of values for each of the plurality of graphic parameters by using the predictive relationship between the first plurality of values for each of the plurality of graphic parameters and the inertia values of the power system.

16. The computer program product of claim 15, wherein the operations further comprise:

subtracting a first common frequency component from the first plurality of power system frequency measurements; and subtracting a second common frequency component from the second plurality of power system frequency measurements;

wherein generating the first plurality of multi-dimensional ellipsoids comprises:

generating the first plurality of multi-dimensional ellipsoids responsive to subtracting the first common frequency component from the first plurality of power system frequency measurements; and wherein generating the second plurality of multi-dimensional ellipsoids comprises:

generating the second plurality of multi-dimensional ellipsoids responsive to subtracting the second common frequency component from the second plurality of power system frequency measurements.

17. The computer program product of claim 15, wherein the operations further comprise:

adjusting an assignment of a power generator to a load in the power system based on the current inertia value of the power system.

18. The computer program product of claim 15, wherein the plurality of graphic parameters comprises ellipsoid volume, ellipsoid eccentricity, ellipsoid center vector, or a projection vector of a longest semi-axis of the respective ellipsoid.

19. The computer program product of claim 18, wherein the plurality of graphic parameters further comprises a plurality of ellipsoid center vectors corresponding to the plurality of PMUs, respectively, and a plurality projection vectors of the longest semi-axis of the respective ellipsoids corresponding to the plurality of PMUs, respectively.

* * * * *